United States Patent [19]

Nadd et al.

[11] Patent Number: 5,550,701
[45] Date of Patent: Aug. 27, 1996

[54] POWER MOSFET WITH OVERCURRENT AND OVER-TEMPERATURE PROTECTION AND CONTROL CIRCUIT DECOUPLED FROM BODY DIODE

[75] Inventors: Bruno C. Nadd, Puyvert, France; Talbott M. Houk, Culver City, Calif.

[73] Assignee: International Rectifier Corporation, El Segundo, Calif.

[21] Appl. No.: 298,383

[22] Filed: Aug. 30, 1994

[51] Int. Cl.$^6$ ................................................ H02H 5/04
[52] U.S. Cl. ........................... 361/103; 361/54; 361/100; 257/355
[58] Field of Search ........................ 361/103, 56, 54, 361/57, 18, 98, 100, 101, 103; 257/355, 328

[56] References Cited

U.S. PATENT DOCUMENTS 4,875,131 10/1989 Leipold et al. ........................ 361/103
5,008,725 4/1991 Lidon et al. ........................ 357/23.4

Primary Examiner—Jeffrey A. Gaffin
Assistant Examiner—Sally C. Medley
Attorney, Agent, or Firm—Ostrolenk, Farber, Gerb & Soffen, LLP

[57] ABSTRACT

An NPN transistor is added to the chip of a power integrated circuit which contains a power MOSFET and a control circuit in a common chip. The NPN transistor is coupled between the P well containing the integrated circuit components and the N type substrate of the chip and is turned on in response to the forward biasing of the body diode of the power MOSFET. A depletion mode control MOSFET transistor is coupled, through a fault latch circuit, to the power MOSFET gate and is in series with a capacitor. The node between the power MOSFET gate and capacitor is decoupled from the N type substrate when the bipolar transistor turns on, to turn off the power MOSFET.

9 Claims, 7 Drawing Sheets

POWER MOSFET WITH OVERCURRENT AND OVER-TEMPERATURE PROTECTION AND CONTROL CIRCUIT DECOUPLED FROM BODY DIODE

NOTICE OF RELATED CASES

This application is related to and is an improvement of copending application Ser. No. 08/121,288, filed Sep. 14, 1993, in the name of Bruno Nadd, entitled "POWER MOSFET WITH OVERCURRENT AND OVER-TEMPERATURE PROTECTION", and is assigned to the assignee of the present invention.

BACKGROUND OF THE INVENTION

This invention relates to power MOSFETs having integrated control circuits on a common chip, and more particularly relates to a novel control circuit which prevents the false resetting of the control circuit fault latch, and which decouples the entire control circuit P well (in an N channel device) from the MOSFET body diode.

The device of application Ser. No. 08/121,288, referred to above, is a fully protected three-terminal monolithic "Smart Power" MOSFET that features overcurrent shutdown for short circuit protection and a gate-to-drain clamp for overvoltage protection. More specifically, the device is simply a power MOSFET with a control circuit powered from its gate-to-source voltage. This FET device is a "SMARTFET", a trademark of the International Rectifier Corporation, the assignee of the present invention. Within the control circuit are 1) an on/off circuit, or power MOSFET driver which responds to an externally applied input-to-source voltage, and the output of a logic circuit, 2) an overcurrent protection circuit, 3) an over-temperature protection circuit, and a logic circuit to process all of these control signals. In addition, the device contains an active drain-to-gate over-voltage clamp circuit. In either an over-temperature or overcurrent condition, a fault latch within the logic circuit is supposed to set, turning the power MOSFET off. Furthermore, this latch should remain set until the power MOSFET input-to-source voltage (which provides the power for the latch) is cycled to zero.

We have found that in certain applications, for example, when the power MOSFET is driving an inductive load in a "low side switch" configuration, and during a so-called "clamped inductive flyback" in response to an over-temperature condition in the power MOSFET that the fault circuit can be unintentionally reset even though the fault condition still exists.

More specifically, in the simple case of a grounded-source power MOSFET (without integrated control circuits), used as a d-c switch driving an inductive load which is tied between the MOSFET drain and a positive power supply, the sum of conduction and switching losses within the MOSFET could become high enough to drive the die junction temperature to a high enough value that the reliability of the device would suffer. With a SMARTFET device, however, if the power device junction temperature rises above a predefined threshold (typically 160° C.), the control fault latch will set, pulling the MOSFET gate low, turning it off. Once the MOSFET gate has been pulled low, the current in the inductive load will need to decay, so the voltage across the load reverses (since V=Ldi/dt, and di/dt is negative), and the power MOSFET drain voltage will rise. In the absence of any clamping, and with a heavily inductive load, this drain voltage can rise until the power MOSFET drain-to-source junction breaks down, after which the decaying load current flows through the MOSFET drain-to-source junction.

Because power MOSFETs are not very rugged in this breakdown region of operation, SMARTFET devices have an active drain-to-gate clamp which turns the power MOSFET on when the drain-to-gate voltage exceeds a predetermined threshold, and at a drain-to-source voltage less than the breakdown voltage of the drain-to-source diode. In this way, the energy which can be absorbed by the power MOSFET (normally referred to as its "avalanche rating") may be greatly increased (by a factor of 10–100).

Accordingly, in the above-mentioned SMARTFET device over-temperature condition, the gate would initially be pulled low, the drain would go high (MOSFET off), and then the gate would be pulled high again by the drain-to-gate clamp (the drain-to-gate clamp overrides the fault latch signal). However, even while the drain-to-gate clamp and power MOSFET are on, the fault latch is required to maintain its "latched off" logic state, so that once the current in the inductive load has decayed to near zero, the drain voltage recovers with the power MOSFET off.

The problem we have observed is that once the load current has decayed sufficiently, the recovery of the drain voltage in a standard power MOSFET can, in certain applications, appear as a poorly damped oscillation which eventually settles out to the supply voltage and which can, in a transient mode, forward bias the drain-to-source body diode of the device. When this body diode is forward biased, parasitic inverse bipolar NPN action occurs between the drain/epi (NPN emitter) voltage, the control circuitry P well tied to the power MOSFET source (NPN base), and any N+ region at the surface of the semiconductor control circuit (multiple NPN collectors). The latter N+ regions could be formed, for example, by the drain or source regions of NMOS devices used in the control circuit. In the case of a typical NMOS inverter, such a parasitic NPN would cause the output of the inverter to become a logic low, regardless of its input voltage. The body diode conduction of the power MOSFET then causes the fault latch to be reset so that, after recovering from an over-temperature shutdown condition, the power MOSFET is on when it should be off, which defeats the purpose of over-temperature protection.

SUMMARY OF THE INVENTION

One feature of the present invention is to prevent this parasitic NPN from causing the logic circuit to malfunction by introducing another intentional inverse NPN transistor.

The novel inverse NPN P well bias may also be used for the entire control circuit P well, to decouple the entire control circuit P well from the MOSFET body diode. Thus, in many applications of SMARTFET devices, for example, in an H-bridge circuit, the designer will utilize the body diode of a power MOSFET to recirculate the load current. In this case, the body diode does not conduct for a brief transient, but conducts large current for up to many milliseconds. The parasitic NPN transistor associated with all of the control circuitry, including a large N+ to P-body input protection zener, will conduct. Not only will the control circuitry then malfunction, but the large N+ region in the input protection structure will pull the input pin of the SMARTFET device below ground. Thus, in one test, it was found that when the FET body diode conducted 1 ampere, the input pin collected 50mA. This would be catastrophic to whatever circuit was driving the SMARTFET.

The application of the above-described new idea of a deliberately introduced parasitic inverse NPN transistor alleviates this condition.

In more detail, the novel circuit of the invention employs a capacitor to hold the voltage at one of the inputs to the fault latch high (which represents holding the power MOSFET off) during the body diode transient, thus ensuring that when the drain of the MOSFET has fully recovered, the power device remains off.

A second aspect of this circuit involves tieing the P well in which the switch which drives the holding capacitor and input in the fault latch (the P well) close to the epi potential during the body diode transient, thus disabling the inverse NPN associated with that P well. In effect, a deliberately designed inverse NPN to hold off the parasitic inverse NPN associated with a specific NMOS device P well within the fault latch is provided, and relies upon the voltage on the holding capacitor to ensure that, when the drain of the power MOSFET recovers, the fault latch is set in the proper state.

Other features and advantages of the present invention will become apparent from the following description of the invention which refers to the accompanying drawings.

DETAILED DESCRIPTION OF THE INVENTION

Figure 1:
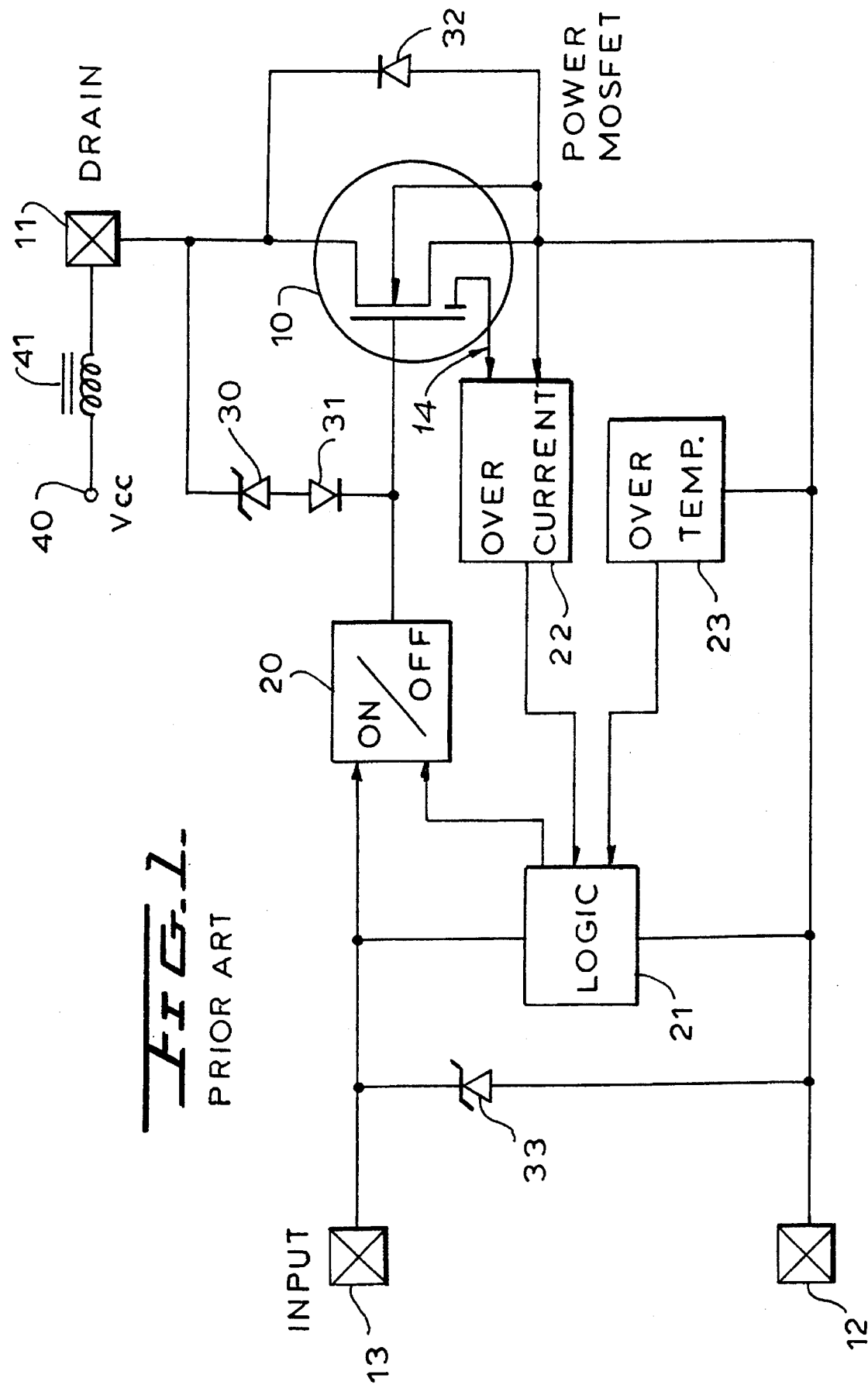
FIG. 1 is a block circuit diagram of a known type of power MOSFET with integrated control circuits, used as a low-side switching regulator, driving an inductive load.
Figure 2:
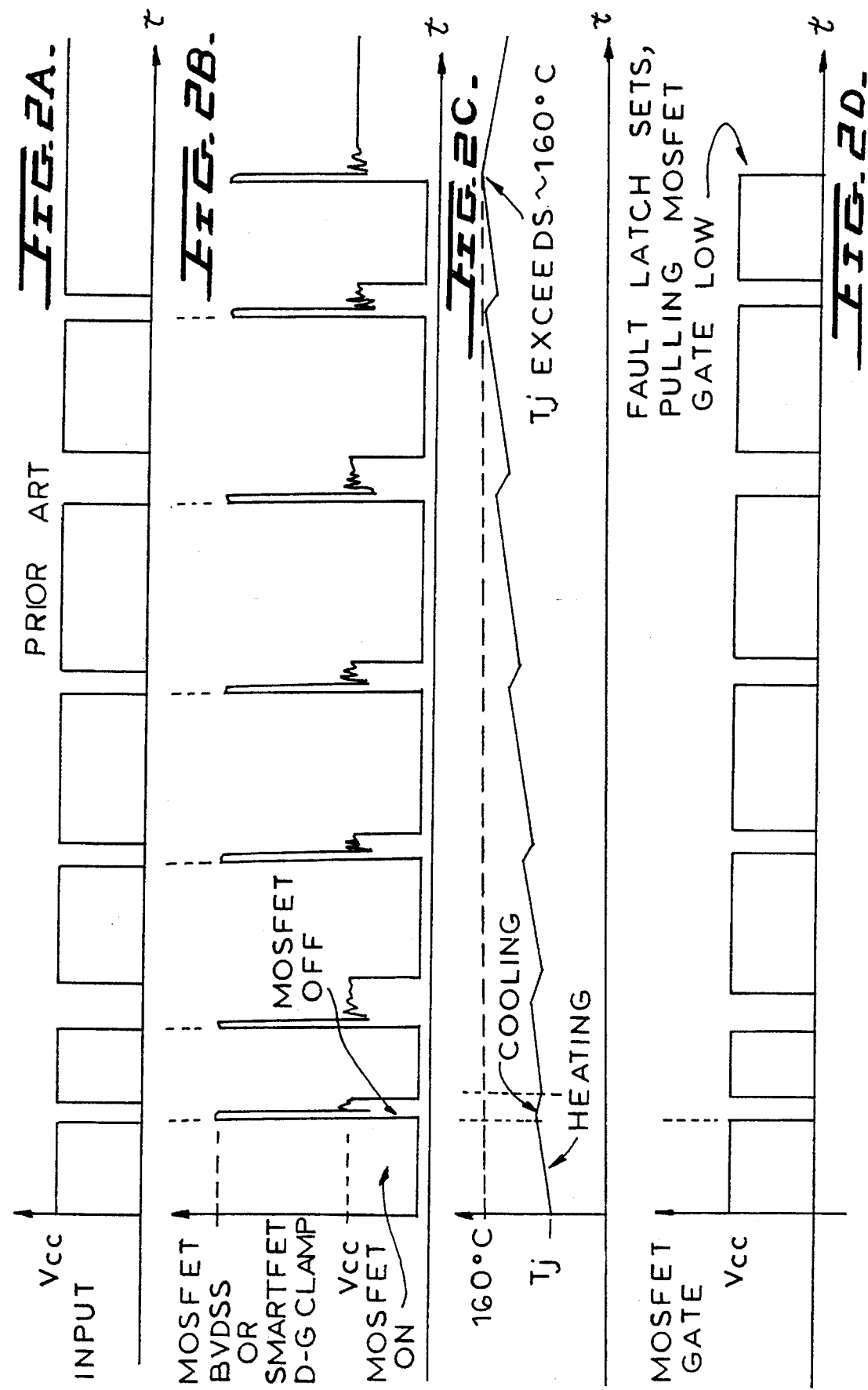
FIG. 2A shows the input voltage as a function of time.
FIG. 2B shows the reverse voltage induced across the device due to the clamped inductive load in FIG. 1, on the same time line as FIG. 2A.
FIG. 2C shows the temperature of the power MOSFET junctions, responsive to a fault into the inductive load, on the same time line as FIG. 2A.
FIG. 2D shows the power MOSFET gate voltage on the same time line as FIG. 2A.

Referring first to FIG. 1, there is shown a known power integrated circuit in which a power MOSFET section 10 is integrated with control circuits in the same silicon chip.

The power MOSFET 10 is shown as a current-sensing device, having a drain pin 11, source pin 12, and input 13, the device being contained within a three-pin TO220 type housing. Such a device can be a pin-compatible replacement for any TO220 power MOSFET. However, the invention to be described is applicable to any power integrated circuit package.

The overall device may be used in any circuit for example, circuits for reverse voltage ratings of 60 volts but, more generally, circuits which range from 30 volts to in excess of 600 volts. The input voltage at terminal 13 can be about 10 volts or less. An auxiliary current-sensing output 14 is also provided.

The control circuit, which is integrated into the same silicon chip as contains power MOSFET 10 includes the ON/OFF switch circuit 20, which can be a MOSFET circuit, a logic circuit 21 which, as will be later described, is modifiable to include the novel features of the invention, an overcurrent monitor circuit 22 and an over-temperature monitor circuit 23. Circuits 20 to 23 may be constructed as shown in copending application Ser. No. 08/121,288.

A clamp circuit consisting of zener diode 30 and reverse-poled diode 31 is connected across the gate to drain electrodes of power MOSFET 10. Power MOSFET 10 also has an integral diode 32, as shown. A further zener diode clamp 33 is connected between the source 12 and input 13 pins.

The circuit of FIG. 1 is commonly used to drive an inductive load. Thus, a source of voltage VCC at terminal 40 is shown schematically as in series with inductor 41 and drain pin 11.

The circuit of FIG. 1 operates as follows:

To turn on the power MOSFET 10, an input voltage is applied at pin 13. This turns on the ON/OFF switch circuit 20 to charge the gate-to-source capacitance of MOSFET 10 to turn it on. Current can then flow from terminal 40, through inductive load 41, to drain pin 11, through MOSFET 10 and to source pin 12. If either an overcurrent or over-temperature fault is sensed by circuits 22 or 23, respectively, the logic circuit 21 is activated to turn off switch 20 and thus the power MOSFET 10. Similarly, if the input signal at pin 13 is removed, the ON/OFF switch 20 turns off the power MOSFET 10.

Clamp circuit 30–31 acts to turn on during the turn off operation of MOSFET 10 to prevent avalanche breakdown in MOSFET 10 during turn off. Thus, the clamp 30 sets a threshold which is below avalanche voltage to prevent parasitic turn on, and allowing the power FET to handle all energy during turn off.

FIGS. 2A, 2B, 2C and 2D show the waveforms which appear in the circuit of FIG. 1 during an over-temperature condition when the circuit is being used in a switching regulator in which the power MOSFET 10 is switched on and off with some variable frequency and duty cycle, as determined by the user's input to input pin 13 in FIG. 1.

FIG. 2A shows the input voltage at pin 13. FIG. 2B shows the drain voltage on MOSFET 10, as clamped by clamp 30 in FIG. 1. Thus, when the input signal turns MOSFET 10 off, the drain voltage has a high peak due to the clamped inductive load. After reaching the peak and being clamped, the drain voltage reduces, and rings around the voltage VCC. This action is later described in more detail in FIG. 3.

FIG. 2C shows the junction temperature Tj of MOSFET 10, which is proportional to continuous drain current. The over-temperature circuit 23 of FIG. 1 is designed to have a threshold temperature of 160° C., at which the MOSFET 10 of FIG. 1 turns off. Note that while power MOSFET 10 conducts, the temperature Tj increases and, when MOSFET 10 is off, the temperature Tj decreases. Note also that, for the example of FIG. 2C, the temperature Tj eventually exceeds 160° C.

FIG. 2D schematically shows the gate voltage of MOSFET 10. Thus, at the point where Tj exceeds 160° C. (FIG. 2C), the fault latch within logic block 21 sets in FIG. 2D and turns off the power MOSFET 10 by pulling the power MOSFET gate low (not shown in FIG. 1). The fault latch can only be reset after a turn off by the logic circuit 21 by cycling the input pin 13 to ground.

Figure 3:
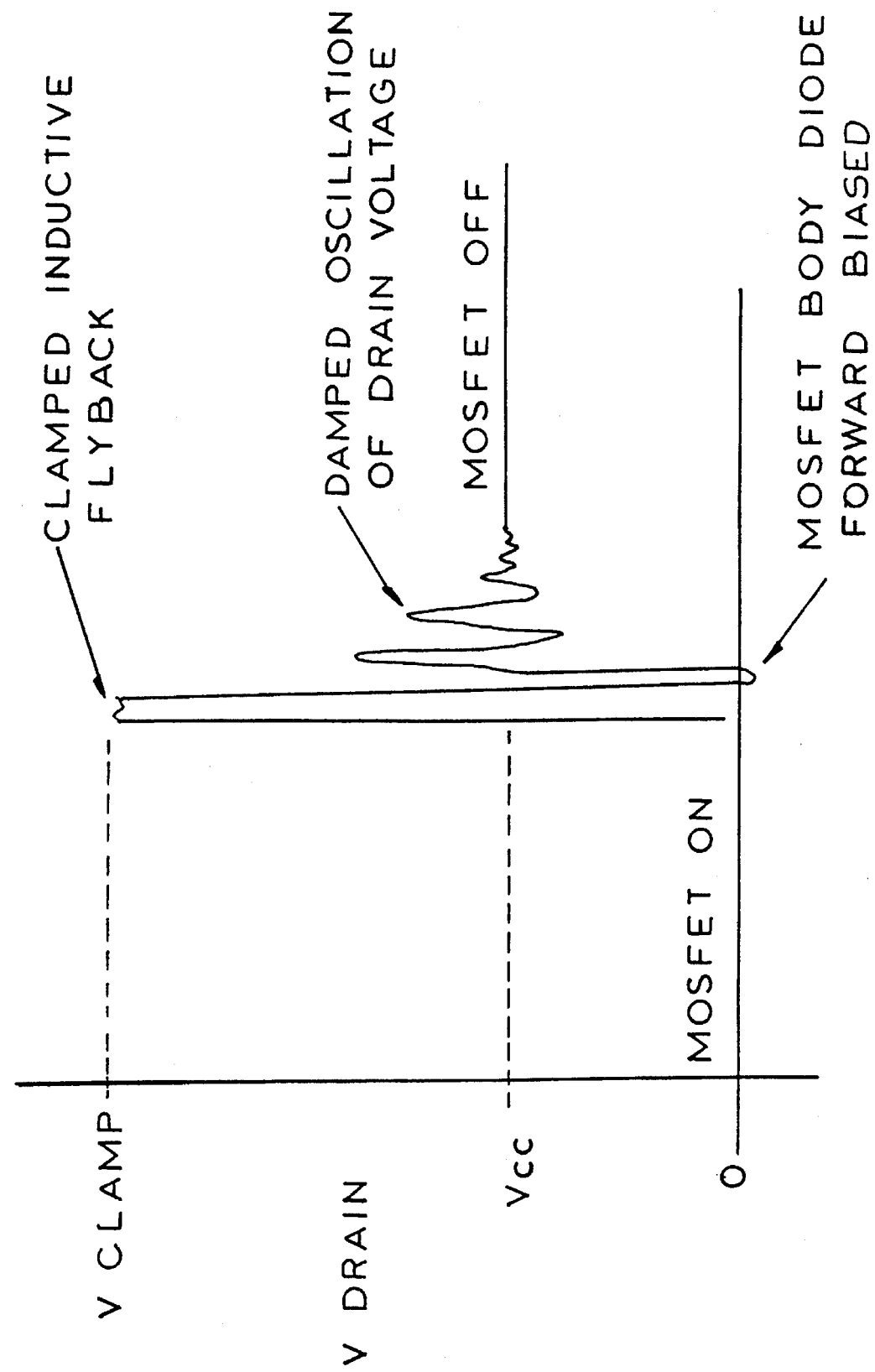
FIG. 3 shows, in enlarged form, the damped oscillation of the drain voltage of the power MOSFET of FIG. 1 in a circuit using the clamped inductive flyback, and illustrates how the body diode of the MOSFET can become forward biased.

FIG. 3 shows the damped oscillation of the drain voltage of MOSFET 10 due to clamped inductive flyback. When the MOSFET 10 is on, the voltage is zero or low. When MOSFET 10 turns off, however, the drain voltage raises to the clamp voltage set by clamp 30. The drain voltage then oscillates or rings about the voltage VCC due to stray capacitance in the circuit.

It has been found that when the temperature Tj is high, the first downward swing of the drain voltage may go below zero, as shown in FIG. 3. At that point, the MOSFET body diode of MOSFET 10 becomes forward biased and injects minority carriers into the P type regions of the MOSFET 10, as will be later shown. This injection of minority carriers will also occur in the control circuit components of the integrated circuit, thus invalidating their operation.

Figure 4:
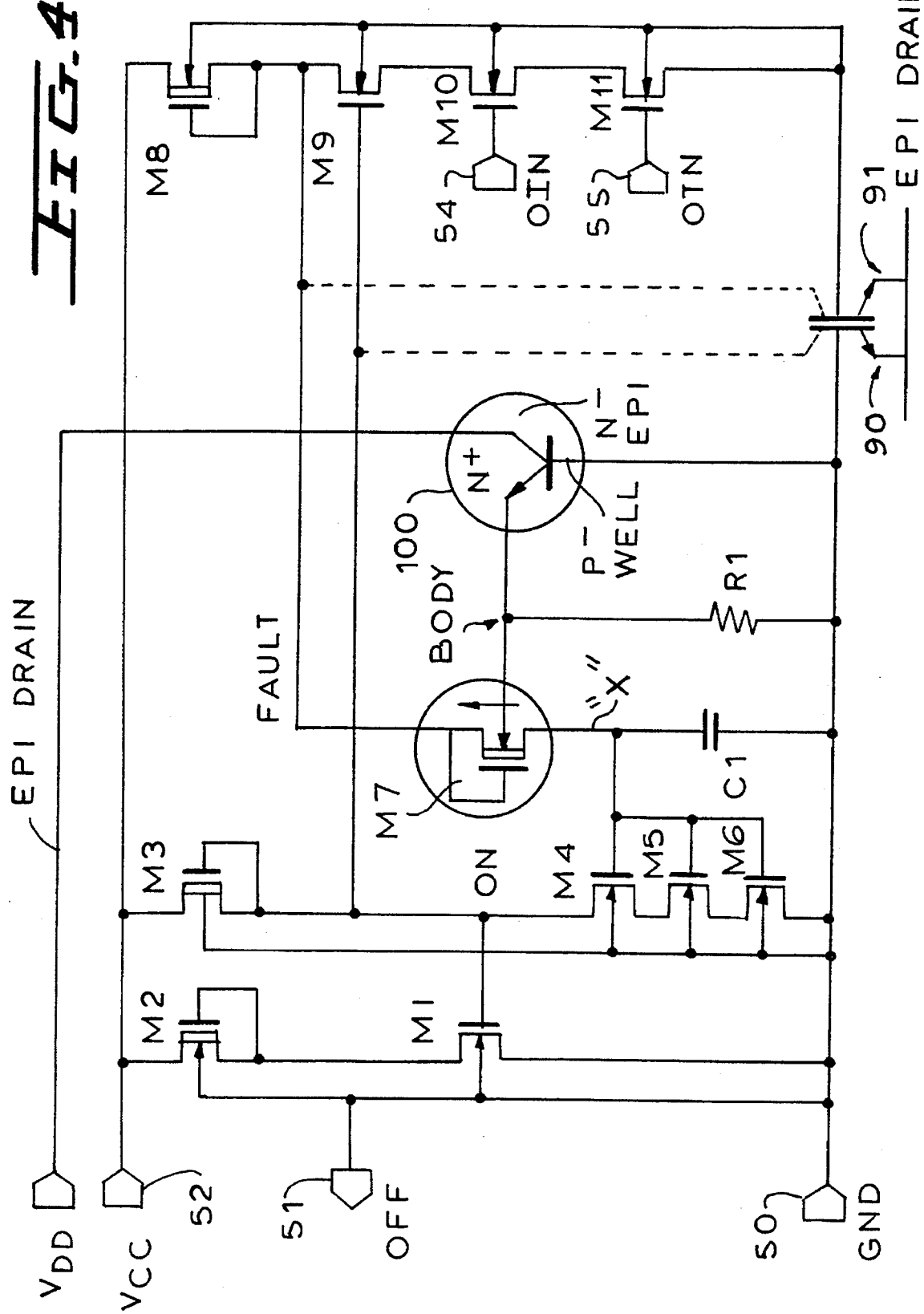
FIG. 4 shows the input logic circuit of FIG. 1, which employs a novel, intentional parasitic NPN transistor which, when turned on, isolates the control P well from the body diode of the power MOSFET, and a novel short-time storage capacitor.

FIG. 4 is a schematic diagram of the input logic block 21 of FIG. 1. The inputs to the logic circuit of FIG. 4 include ground 50, an output OFF terminal 51 (to ON/OFF circuit 20 in FIG. 1), input VCC terminal 52, input VDD terminal 53 (from drain pin 11 of FIG. 1), overcurrent input pin 54 and over-temperature input pin 55. The input terminal 55 goes low when the junction temperature in FIG. 2 reaches 160° C.

A number of MOS control transistors M1 to M11 are identified in FIG. 4, which are integrated into the silicon which also contains the junctions for the power MOSFET 10. The two numbers alongside the transistors M1 to M11, for example 6/60 for transistor M2, describe the ratio of the gate width to gate length for the transistor in the preferred embodiment of the invention. These transistors are usually formed in a P well which is spaced laterally from the N channel power MOSFET section, and have the following functions:

MOSFETs M1 and M2 form an inverter and switch the OFF terminal 51 between high and low, depending on the gate voltage on transistor M1 from the ON node.

Transistors M9, M10 and M11 act as a NAND circuit and, when any of their inputs go low, the "FAULT" line goes high. Transistors M8 and M3 are depletion mode dummy load transistors.

In accordance with one aspect of the invention, a novel transistor M7, shown as a depletion mode NMOS device, turns on, and acts like a MOSFET diode during the time that FAULT is high. The function of transistor M7 will be later discussed.

Transistors M4, M5 and M6 are turned on when FAULT goes high. The node ON then goes low. Note that transistors M4, M5 and M6 are cross-coupled with transistors M9, M10 and M11, to produce a regenerative effect.

Capacitor C1 is provided to store, for a short time (a few micro seconds), the condition of node X.

There are also a number of unintended parasitic NPN transistors in the circuit of FIG. 4, such as parasitic transistor 91. These transistors are disposed in the P well containing the control circuit and will turn on when the MOSFET body diode is forward biased (FIG. 3). When they turn on, they erroneously set the latch and turn the power MOSFET back on.

In order to offset this operation of the parasitic transistor 91, an NPN transistor 100 (also a parasitic transistor) is intentionally added to the circuit. Transistor 100 controls the P well of the novel switch M7. Switch M7 is isolated from the power MOSFET section since its P region is not electrically shorted to ground. Resistor R1 is also provided in order to bias the P well of switch M7 to the ground potential during normal operation. The parasitic transistor 100 also turns on with transistor 91 but, when transistor 100 turns on, it pulls the P well in which the transistor M7 sits close to the epi potential. This then isolates node "X" from the "FAULT" node while the body diode of MOSFET 10 is conducting. So during this conduction period, nodes ON and FAULT are pulled below ground, and node "X" is high. Depletion mode NMOS transistor M7 behaves as a low valued current source, and is designed to allow node "X" to stay at a logic high level for at least as long as the conduction period of the MOSFET 10 body diode. Any other transistor, or circuit which performs the above-stated function can be used in place of MOSFET M7.

Once the MOSFET 10 conduction period is over, the parasitic NPN transistors 90 and 91 turn off, and the circuit recovers with a logic high level at node "X". This logic high level at node "X" then forces ON low, ensuring that the MOSFET 10 is held off after its body diode conduction.

Figure 5:
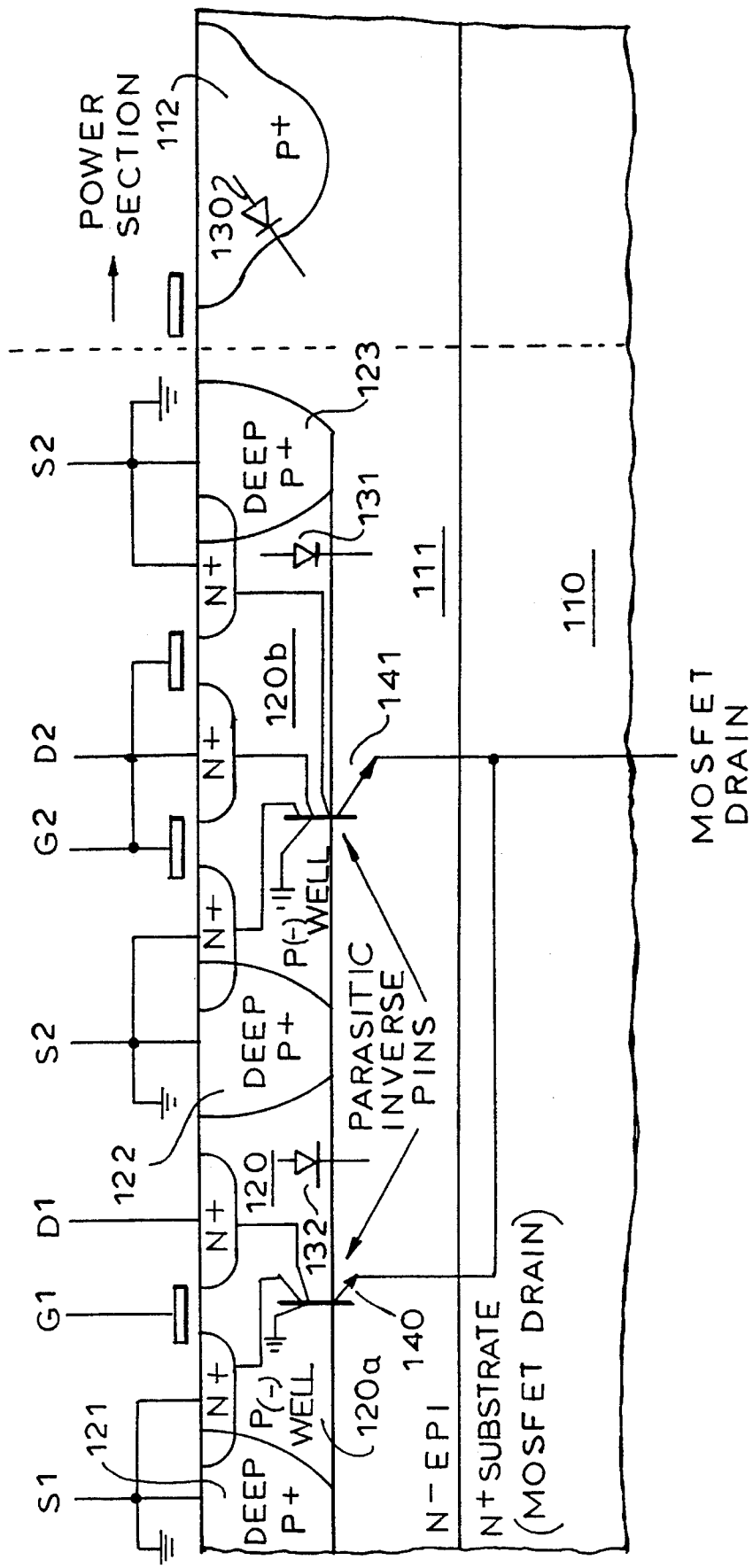
FIG. 5 is a cross-section of the junction pattern of a power integrated circuit incorporating the present invention.

FIG. 5 shows the junction pattern of the power MOSFET and control circuits for a SmartFet device made in accordance with the invention, and shows the location of the parasitic inverse NPN transistors. In FIG. 5, the portion of the chip shown has an N+ substrate 110, which may also act as the power MOSFET drain of FIG. 1. An N(–) epitaxial layer 111 ("epi") receives the cells such as cell 112 of the power MOSFET section, which may each have the structure shown in U.S. Pat. No. 5,008,725. The N(–) epi layer 111 also receives P(–) well 120, which may be separated into a number of control circuit wells by P+ sinkers such as sinkers 121, 122 and 123. The P+ sinkers may be formed at the same time as the P+ body portions of the power MOSFET cells 112. Consequently, when the body diode 130 is forward biased (see FIG. 3), all related parasitic body diodes (131, 132) are also forward biased.

Typical control circuits using lateral MOSFETs are shown in P(–) well portions 120a and 120b of P(–) region 120. These P(–) wells also have integral parasitic inverse NPN transistors 140 and 141. These parasitic transistors correspond to transistors 90 and 91 in FIG. 4 and have gain because they have lightly doped P(–) regions. Therefore, when the P+ regions in the chip are forward biased with the body diode of the main power MOSFET, these will turn on.

Figure 6:
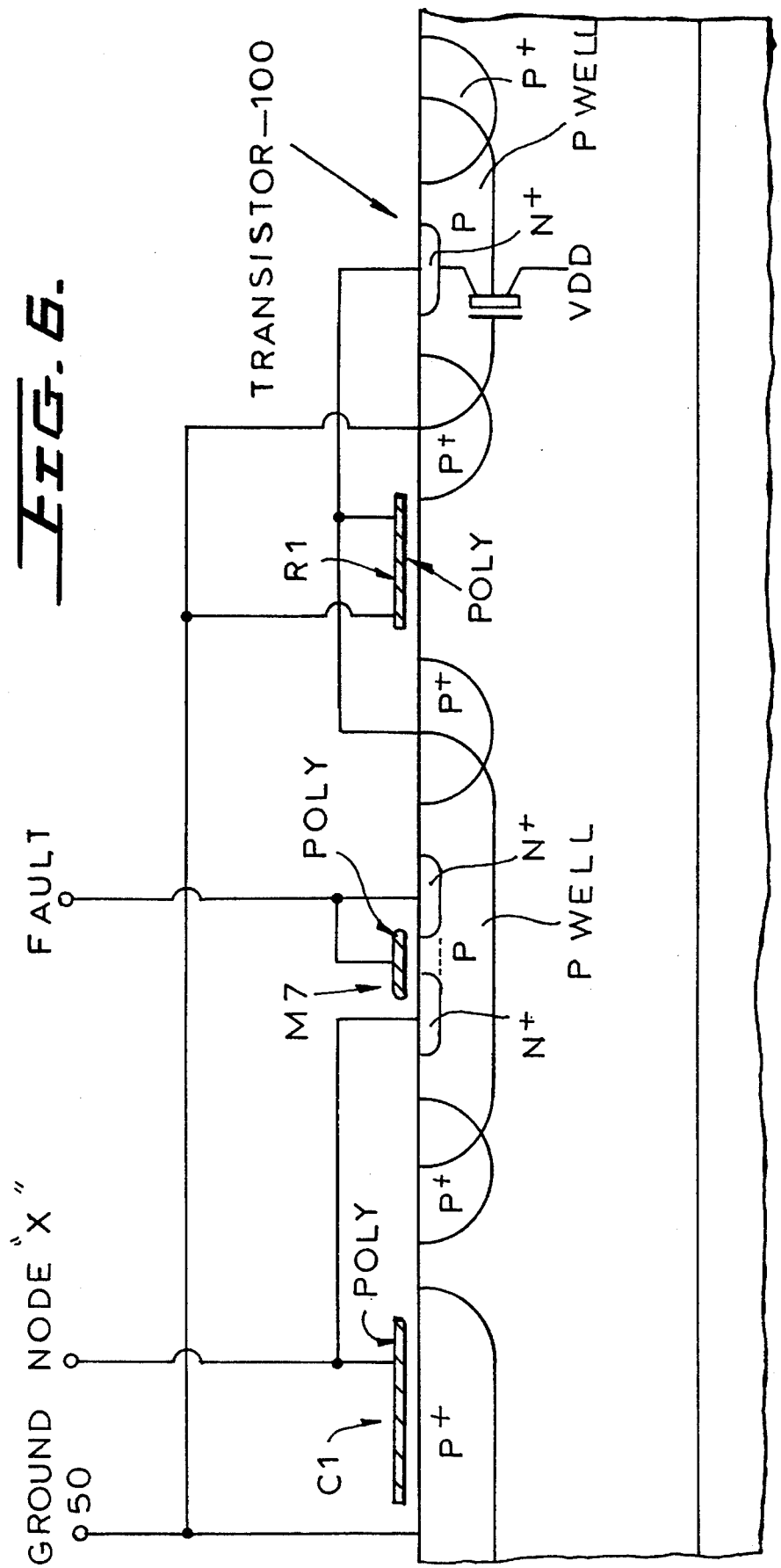
FIG. 6 is a schematic diagram used to illustrate the operation of the present invention.

FIG. 6 shows, in more detail, the location of the transistor 100 of FIG. 4 in the silicon of FIG. 5. Thus, FIG. 6 shows the terminals and nodes for ground 50, node "X", and "Fault" of FIG. 4, and shows the capacitors, formed of a polysilicon plate above the P+ well, the depletion mode transistor M7 of FIG. 4, the polysilicon resistor R1 and the transistor 100.

The operation of the structure of FIG. 6 is as follows:

When VDD goes below ground potential (i.e., when the body diode of MOSFET 10 is forward biased and conducting), transistor 100 turns on in an inverse mode, pulling P well of depletion mode transistor M7 down near the epi (VDD) potential. This prevents any parasitic NPN action within the P well, and allows capacitor C1 to hold the logic level high at node "X". During the time transistor 100 is on, M7 behaves as a low-valued current source, and is designed so as not to discharge capacitor C1 during conduction of the MOSFET 10 body diode. Obviously, if the conduction of the body diode continues indefinitely, M7 will eventually totally discharge C1, and the fault information will be lost. Therefore, the conduction time of this body diode should be finite. Once conduction of the body diode of MOSFET 10 ceases, VDD goes high, transistor 100 turns off, and the latch recovers in a predictable state because of the logic level high at node "X".

Figure 7:
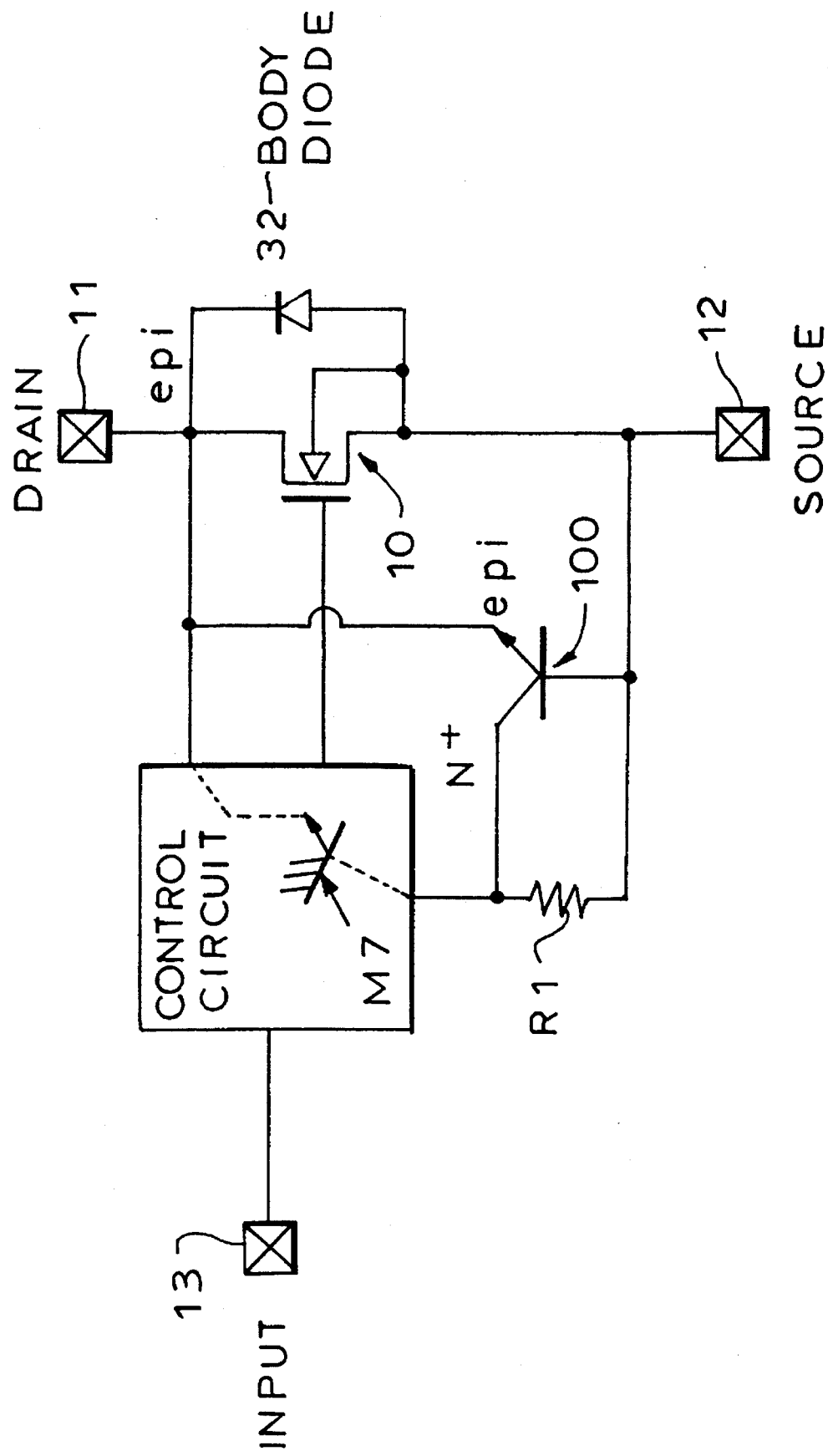
FIG. 7 is a further schematic representation of the operation of the invention.
Figure 4:
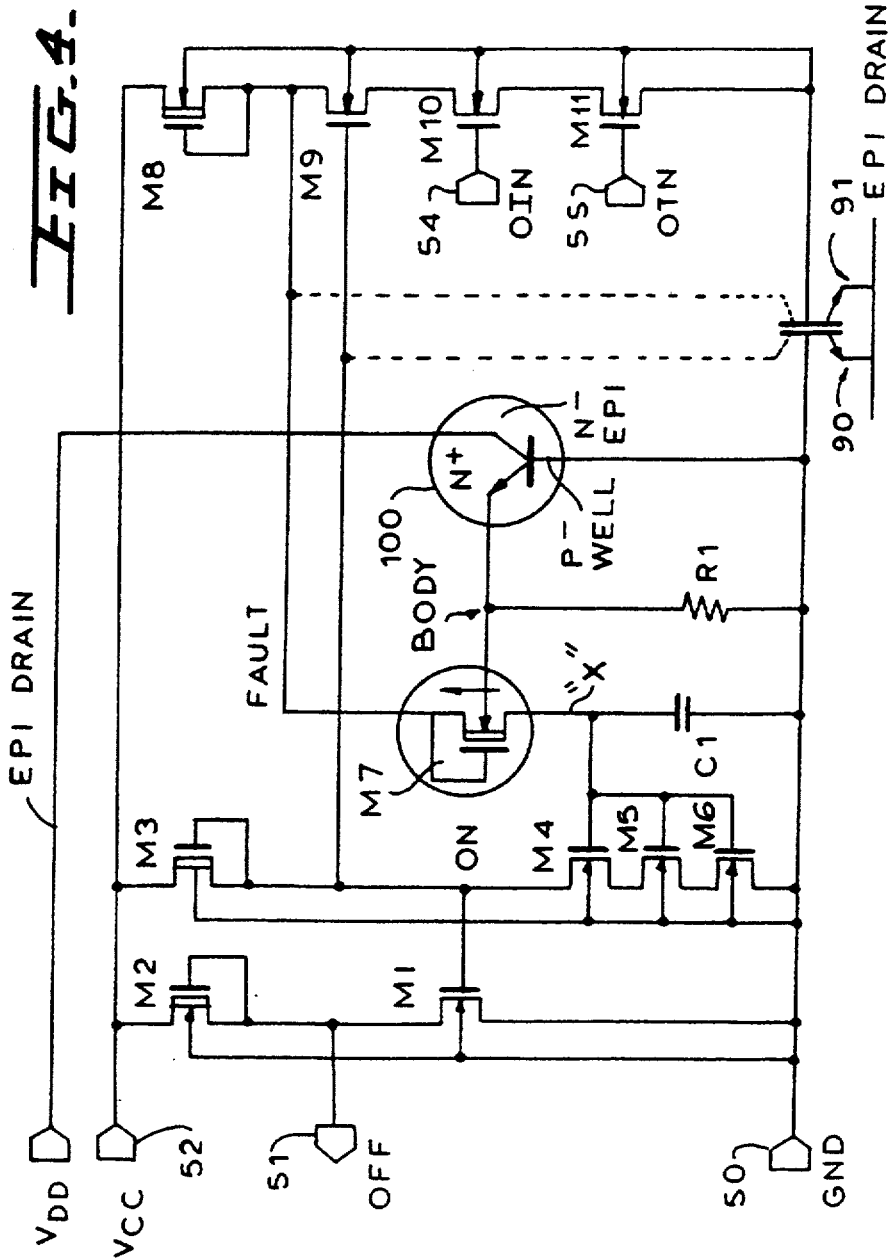

FIG. 7 is another schematic representation of the present invention, showing again the relationship of resistor R1, transistor 100 and the parasitic NPN transistor M7 in the schematically illustrated control circuit. Transistor M7 is the NPN transistor associated with the P well-to-epi junction diode. In accordance with the invention, this transistor M7 is held off, or at high impedance, during conduction of the body diode 32 of the main power MOSFET 10 due to the turn on of transistor 100.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power MOSFET having a junction region formed in a silicon chip and including a fault responsive signal circuit integrated into the silicon chip; said power MOSFET comprising an N-type silicon substrate containing a plurality of cells found in respective P-type bodies formed in said N-type silicon substrate; each of said cells having common source, drain and gate electrodes; a P-type well formed in said N-type silicon substrate; said fault responsive signal circuit being formed in said P-type well; said fault responsive signal circuit including a fault latch circuit means coupled to said gate electrodes for turning off said power MOSFET in response to a fault condition; said fault responsive signal circuit including a bipolar transistor integrated into said P-type well and being connected to be turned on in an inverse mode in response to the forward biasing of the body diode of said power MOSFET; said bipolar transistor shorting said N-type substrate to said P-type well when turned on, and a series connected control MOSFET transistor integrated into a second P-type well being turned off in response to turn on of said bipolar transistor, thereby preventing activation of a parasitic transistor formed of said N-type silicon substrate, said second P-type well and at least one N-type region formed in said second P-type well; said control MOSFET transistor coupled to said fault latch circuit means for said power MOSFET to disable said gates and turn off said power MOSFET when said control MOSFET transistor conducts.

2. The device of claim 1 which further includes a capacitor connected in series with said control MOSFET transistor, whereby a node between said control MOSFET transistor and said capacitor is decoupled from said N type substrate when said bipolar transistor turns on.

3. The device of claim 2 wherein said control MOSFET transistor is a depletion mode MOSFET.

4. The device of claim 2 which further includes a resistor coupled between a body of said control MOSFET and in closed circuit with said capacitor and a main electrode of said control MOSFET.

5. The device of claim 2 wherein said fault latch circuit means is operated in response to an over-temperature condition.

6. The device of claim 5 which further includes a resistor coupled between a body of said control MOSFET and in closed circuit with said capacitor and a main electrode of said control MOSFET.

7. The device of claim 6 wherein said control MOSFET transistor is a depletion mode MOSFET.

8. The device of claim 1 wherein said control MOSFET transistor is a depletion mode MOSFET.

9. The device of claim 1 wherein said fault latch circuit means is operated in response to an over-temperature condition.

* * * * *

UNITED STATES PATENT AND TRADEMARK OFFICE
CERTIFICATE OF CORRECTION

PATENT NO. : 5,550,701
DATED : Aug. 27, 1996
INVENTOR(S) : Nadd et al.

It is certified that error appears in the above-indentified patent and that said Letters Patent is hereby corrected as shown below:

Column, 6, line 19, change "10" to --body diode--.

IN THE DRAWINGS:

Figure 4, the line drawn from terminal 51 is extended to intersect the vertical line between the terminals of M2 and M1, the existing connection dot at the node between the line drawn from terminal 51 and the line between the body regions of M1 and M2 is deleted, and a new connection dot placed at the node between the line extending from terminal 51 and the line connecting the terminals of M2 and M1. A corrected copy is attached hereto.

Signed and Sealed this

Fifteenth Day of September, 1998

Attest:

BRUCE LEHMAN

Attesting Officer

Commissioner of Patents and Trademarks